United States Patent
Aseev et al.

(10) Patent No.: US 12,412,743 B2
(45) Date of Patent: Sep. 9, 2025

(54) METHOD OF FABRICATING A HOLLOW WALL FOR CONTROLLING DIRECTIONAL DEPOSITION OF MATERIAL

(71) Applicant: Microsoft Technology Licensing, LLC, Redmond, WA (US)

(72) Inventors: Pavel Aseev, Delft (NL); Ekaterina Chernysheva, Delft (NL); Amrita Singh, Delft (NL); Guanzhong Wang, Delft (NL)

(73) Assignees: Microsoft Technology Licensing, LLC, Redmond, WA (US); Delft University of Technology, Delft (NL)

( * ) Notice: Subject to any disclaimer, the term of this patent is extended or adjusted under 35 U.S.C. 154(b) by 18 days.

(21) Appl. No.: 17/756,812

(22) PCT Filed: Dec. 5, 2019

(86) PCT No.: PCT/US2019/064705
§ 371 (c)(1),
(2) Date: Jun. 2, 2022

(87) PCT Pub. No.: WO2021/112856
PCT Pub. Date: Jun. 10, 2021

(65) Prior Publication Data
US 2023/0008296 A1 Jan. 12, 2023

(51) Int. Cl.
*H01L 21/02* (2006.01)
*H01L 21/3105* (2006.01)
(Continued)

(52) U.S. Cl.
CPC .. *H01L 21/02639* (2013.01); *H01L 21/02546* (2013.01); *H01L 21/02549* (2013.01);
(Continued)

(58) Field of Classification Search
CPC ......... H01L 21/02639; H01L 21/02546; H01L 21/02549; H01L 21/02592; H01L 21/02603; H01L 21/31053
See application file for complete search history.

(56) References Cited

U.S. PATENT DOCUMENTS

| 4,145,699 A | 3/1979 | Hu et al. |
| 4,218,532 A | 8/1980 | Dunkleberger |

(Continued)

FOREIGN PATENT DOCUMENTS

| CN | 1253311 A | 5/2000 |
| CN | 104769732 A | 7/2015 |

(Continued)

OTHER PUBLICATIONS

Guarnieri et al., "Platinum metallization for MEMS application", Biomatter 4, e28822, Apr. 2014 (Year: 2014).*

(Continued)

*Primary Examiner* — Jay C Kim
*Assistant Examiner* — Woo K Lee
(74) *Attorney, Agent, or Firm* — Klarquist Sparkman, LLP

(57) ABSTRACT

A method of fabricating a hollow wall for controlling directional deposition of material comprises: forming a layer of resist on a substrate; removing a portion of the resist selectively to form a channel in the resist; forming a layer of an amorphous dielectric material in the channel; and removing the resist to form the hollow wall. The channel has a front surface configured to prevent bending of a corresponding front face of the hollow wall. The hollow wall is useful for controlling deposition of material when fabricating semiconductor-superconductor hybrid devices, for example. By configuring the channel appropriately, bending of the hollow wall can be prevented, allowing for more precise deposition (Continued)

of material. Also provided is a further method of fabricating a hollow wall; and a method of fabricating a device using the hollow walls.

15 Claims, 9 Drawing Sheets

(51) Int. Cl.
    *H10N 60/01* (2023.01)
    *H10N 60/85* (2023.01)
(52) U.S. Cl.
    CPC .. *H01L 21/02592* (2013.01); *H01L 21/02603* (2013.01); *H01L 21/31053* (2013.01); *H10N 60/01* (2023.02); *H10N 60/85* (2023.02)

(56) References Cited

U.S. PATENT DOCUMENTS

| | | | |
|---|---|---|---|
| 4,673,960 A * | 6/1987 | Chao | H01L 21/28587 257/283 |
| 5,468,595 A | 11/1995 | Livesay | |
| 8,563,395 B2 | 10/2013 | Mi | |
| 10,629,798 B1 | 4/2020 | Kallaher et al. | |
| 2003/0118950 A1 | 6/2003 | Tsai et al. | |
| 2003/0180474 A1 | 9/2003 | Nishikawa | |
| 2006/0046201 A1 | 3/2006 | Sandhu | |
| 2007/0069273 A1 | 3/2007 | Rohr | |
| 2011/0165327 A1 | 7/2011 | Park et al. | |
| 2013/0217565 A1 | 8/2013 | Kastalsky | |
| 2017/0250381 A1 | 8/2017 | Okawara | |
| 2018/0090662 A1 | 3/2018 | Stevenson et al. | |
| 2018/0358537 A1 | 12/2018 | Brink et al. | |
| 2018/0358538 A1 | 12/2018 | Brink et al. | |
| 2019/0204753 A1 | 7/2019 | Burkett et al. | |
| 2020/0176663 A1 * | 6/2020 | Krogstrup Jeppesen | H10N 60/01 |
| 2020/0243742 A1 | 7/2020 | Ramakers et al. | |
| 2021/0296560 A1 | 9/2021 | Ramakers et al. | |
| 2022/0157932 A1 | 5/2022 | Jespersen et al. | |
| 2023/0106283 A1 | 4/2023 | Memisevic et al. | |

FOREIGN PATENT DOCUMENTS

| | | |
|---|---|---|
| CN | 109844637 A | 6/2019 |
| DE | 102017002616 A1 | 9/2018 |
| EP | 3475760 A1 | 5/2019 |
| KR | 20150120543 A | 10/2015 |
| KR | 20150120546 A | 10/2015 |
| KR | 101757736 B1 | 7/2017 |
| WO | 2009029302 A2 | 3/2009 |
| WO | 2017217961 A1 | 12/2017 |
| WO | 2019001753 A1 | 1/2019 |
| WO | 2019099171 A2 | 5/2019 |
| WO | 2021110275 A1 | 6/2021 |

OTHER PUBLICATIONS

Guarnieri et al., "Platinum metallization for MEMS application", Biomatter, 4:1, e28822, DOI: 10.4161/biom.28822, 2014 (Year: 2014).*
Desbiolles et al., "Ion beam etching redeposition for 3D multimaterial nanostructure manufacturing", Microsystems & Nanoengineering, 5:11 (https://doi.org/10.1038/s41378-019-0052-7, Published online: Apr. 22, 2019) (Year: 2019).*
"Notice of Allowance in U.S. Appl. No. 17/332,908", Mailed Date: Sep. 27, 2023, 7 Pages.
"Decision to grant a European patent pursuant to Article 97(1) EPC" in European Patent Application No. 22167178.7, Mailed Date: Jul. 20, 2023, 2 Pages.
"Non Final Office Action Issued in U.S. Appl. No. 17/332,908", Mailed Date: Apr. 12, 2023, 10 Pages.
"Notice of Allowance Issued in European Patent Application No. 22167178.7", Mailed Date: Mar. 30, 2023, 8 Pages.
Notice Of Allowance mailed on Jan. 29, 2024, in U.S. Appl. No. 17/332,908, 8 pages.
Office Action Received for Korea Application No. 10-2022-7022916, mailed on Feb. 22, 2024, 16 pages (English Translation Provided).
Office Action Received for Korean Application No. 10-2021-7019145, mailed on Feb. 20, 2024, 25 pages (English Translation Provided).
Office Action Received for Korean Application No. 10-2021-7022655, mailed on Feb. 29, 2024, 10 pages (English Translation Provided).
"Evaporation (deposition)", Retrieved from: https://en.wikipedia.org/wiki/Evaporation_(deposition), Feb. 15, 2020, 4 Pages.
"Mean Free Path", Retrieved from: https://www.pfeiffer-vacuum.com/en/know-how/introduction-to-vacuum-technology/fundamentals/mean-free-path/, Mar. 26, 2020, 8 Pages.
"Notice of Allowance Issued in U.S. Appl. No. 16/246,289", Mailed Date: Dec. 16, 2019, 8 Pages.
"Non Final Office Action Issued in U.S. Appl. No. 16/258,025", Mailed Date: Apr. 30, 2020, 12 Pages.
"Notice of Allowance Issued in U.S. Appl. No. 16/258,025", Mailed Date: Feb. 4, 2021, 8 Pages.
"Notice of Allowance Issued in U.S. Appl. No. 16/258,025", Mailed Date: Oct. 19, 2020, 7 Pages.
"Notice of Allowance Issued in European Patent Application No. 19880935.2", Mailed Date: Aug. 9, 2022, 7 Pages.
"Notice of Allowance Issued in European Patent Application No. 19880935.2", Mailed Date : Dec. 8, 2022, 2 Pages.
"Office Action Issued in Indian Patent Application No. 202147029260", Mailed Date: Feb. 2, 2023, 5 Pages.
"Extended Search Report Issued in European Patent Application No. 22167178.7", Mailed Date: Jul. 14, 2022, 4 Pages.
"Extended Search Report Issued in European Patent Application No. 22167181.1", Mailed Date: Jul. 12, 2022, 10 Pages.
"Extended European Search Report Issued in European Patent Application No. 22179312.8", Mailed Date : Oct. 20, 2022, 12 Pages.
Ariel-Sternberg, Nava, "PMMA Resist Processing Standard Operating Procedure", Retrieved from: https://static1.squarespace.com/static/57b26cc76b8f5b7524bf9ed2/t/59272752d2b857857ae994c6/1495738198009/PMMA_Process_SOP_May2017.pdf, May 2017, 6 Pages.
Aseev, et al., "Selectivity Map for Molecular Beam Epitaxy of Advanced III-V Quantum Nanowire Networks", In Journal of Nano Letters, vol. 19, Issue 1, Dec. 6, 2018, pp. 218-227.
Davies, et al., "Selective Area Growth of III-V Semiconductors by Chemical Beam Epitaxy: Study of Reaction Mechanisms", In Proceedings of Epitaxial Growth Processes, SPIE, vol. 2140, May 11, 1994, pp. 58-67.
Etsu, Shin, "The Difference Between Positive and Negative Photoresist", Retrieved from: http://web.archive.org/web/20191130013210/https://www.microsi.com/the-difference-between-positive-and-negative-photoresist/, Mar. 5, 2013, 2 Pages.
Fahed, Maria, "Selective Area Growth of In-Plane III-V Nanostructures using Molecular Beam Epitaxy", In Thesis Submitted to University of Lille, Nov. 24, 2016, 140 Pages.
Fan, et al., "Semiconductor Nanowires: From Self-Organization to Patterned Growth", In Journal of Small, vol. 2, Issue 6, Jun. 2006, pp. 700-717.
Fukui, et al., "GaAs Tetrahedral Quantum Dot Structures Fabricated Using Selective Area Metalorganic Chemical Vapor Deposition", In Journal of Applied Physics Letters, vol. 58, Issue 18, May 6, 1991, 4 Pages.
Goh, Wuih. , "Selective Area Growth And Characterization of Gan Based Nanostructures by Metal Organic Vapor Phase Epitaxy", In Thesis of Georgia Institute of Technology, May 2013, 121 Pages.
Krizek, et al., "Field Effect Enhancement in Buffered Quantum Nanowire Networks", In Journal of Physical Review Materials, vol. 2, Issue 9, Sep. 7, 2018, 15 Pages.

(56) References Cited

OTHER PUBLICATIONS

Krizek, Filip, "Semiconductor Nanowire Networks Grown by Molecular Beam Epitaxy", In PhD Thesis of University Of Copenhagen, Jul. 20, 2018, 190 Pages.
Liu, et al., "Fabrication of Microelectrodes on Diamond Anvil for the Resistance Measurement in High Pressure Experiment", In Article Microsystem Technologies, vol. 24, Issue 7, Jul. 1, 2018, pp. 3193-3199.
Liu, Ming, "Top-Down Fabrication of Nanostructures", Retrieved From: https://application.wiley-vch.de/books/sample/3527317392_c01.pdf, May 1, 2018, 48 Pages.
Lyu, et al., "Downscaling Metal—Oxide Thin-Film Transistors to Sub-50 nm in an Exquisite Film-Profile Engineering Approach", In Journal of IEEE Transactions on Electron Devices, vol. 64, Issue 3, Mar. 2017, pp. 1069-1075.
Marinins, et al., "Air-Suspended SU-8 Strip Waveguides With High Refractive Index Contrast", In Journal of Photonics Technology Letters vol. 28, Issue 17, Sep. 1, 2016, pp. 1862-1865.
"International Search Report and Written Opinion issued in PCT Application No. PCT/EP20/055338", Mailed Date: Nov. 2, 2022, 15 Pages.
"International Search Report and Written Opinion Issued in PCT Application No. PCT/US19/064705", Mailed Date: Sep. 28, 2020, 18 Pages.
"International Search Report and Written Opinion Issued in PCT Application No. PCT/US19/069024", Mailed Date: Jul. 9, 2020, 10 Pages.
"International Search Report and Written Opinion Issued in PCT Application No. PCT/US20/014202", Mailed Date: Jun. 25, 2020, 18 Pages.
Schallenberg, Timo, "Shadow Mask assisted Heteroepitaxy of Compound Semiconductor Nanostructures", In Doctoral Dissertation of Bavarian Julius-Maximilians-University, Oct. 2, 2004, 135 Pages.
Serban, Elenaa. , "Self-Assembled and Selective-Area Growth of Group III-Nitride Semiconductor Nanorods by Magnetron Sputter Epitaxy", In Doctoral Dissertation of Linkoping University, May 3, 2018, 66 Pages.
"Office Action Issued in Indian Patent Application No. 202147032428", Mailed Date: Feb. 21, 2023, 5 Pages.
U.S. Appl. No. 17/756,812 / US2023-0008296A1, filed Dec. 5, 2019 / Jan. 12, 2023.
U.S. Appl. No. 17/904,794 / US-2023-0106283-A1, filed Feb. 28, 2020 / Apr. 6, 2023.
U.S. Appl. No. 17/382,174 / US2022-0102425 A1, filed Jul. 21, 2021 / Mar. 31, 2022.
U.S. Appl. No. 16/484,088 / US2020-0027919 A1 / U.S. Pat. No. 11,296,145, filed Oct. 26, 2018 / Jan. 23, 2020 / Apr. 5, 2022.
Notice of First Office Action Received for Chinese Application No. 201980088591.3, mailed on Apr. 3, 2024, 12 pages (English Translation Provided).
First Office Action Received for Chinese Application No. 202080009378.1, mailed on Jun. 26, 2024, 15 pages. (English Translation Provided).
Non-Final Office Action mailed on Apr. 10, 2024, in U.S. Appl. No. 17/332,908, 10 pages.
U.S. Appl. No. 16/246,289 / U.S. Pat. No. 10,629,798, filed Jan. 11, 2019 / Apr. 21, 2020.
U.S. Appl. No. 17/332,908 / US2021/0296560A1, filed May 27, 2021 / Sep. 23, 2021.
U.S. Appl. No. 16/258,025 / US2020-0243742 A1 / U.S. Pat. No. 11,024,792, filed Jan. 25, 2019 / Jul. 30, 2020 / Jun. 1, 2021.
Notice of Allowance mailed on Aug. 7, 2024, in U.S. Appl. No. 17/332,908, 8 pages.
Office Action Received for Australian Application No. 2019421376, mailed on Sep. 30, 2024, 2 pages.
Office Action Received for Australian Application No. 2020211895, mailed on Sep. 3, 2024, 3 pages.
Notice of Allowance Received for Korean Application No. 10-2022-7022916, mailed on Sep. 27, 2024, 8 pages. (English Translation Provided).
Intimation to grant received for Indian Application No. 202147032428, mailed on Feb. 23, 2024, 1 page.
Notice of Allowance Received for Chinese Application No. 201980088591.3, mailed on Dec. 5, 2024, 04 Pages (English Translation Provided).
Notice of Allowance Received for Korean Application No. 10-2021-7019145, mailed on Oct. 31, 2024, 08 pages (English Translation Provided).
Office Action Received for Korean Application No. 10-2021-7022655, mailed on Nov. 27, 2024, 6 pages (English Translation Provided).
Communication pursuant to Article 94(3) Received in European Patent Application No. 20705855.3, mailed on Jan. 30, 2025, 04 pages.
Desbiolles, et al., "Ion beam etching redeposition for 3D multimaterial nanostructure manufacturing", Microsystems & Nanoengineering, Apr. 22, 2019, 08 Pages.
Office Action Received for Chinese Application No. 201980102686.6, mailed on Mar. 1, 2025, 16 pages. (English Translation Provided).
Communication pursuant to Article 94(3) received in European Application No. 22167181.1, mailed on Feb. 12, 2025, 4 pages.
Rejection Decision Received for Chinese Application No. 202080009378.1, mailed on Jan. 22, 2025, 15 pages. (English Translation Provided).

\* cited by examiner

METHOD OF FABRICATING A HOLLOW WALL FOR CONTROLLING DIRECTIONAL DEPOSITION OF MATERIAL

CROSS REFERENCE TO RELATED APPLICATIONS

This is the U.S. National Stage of International Application No. PCT/US2019/064705, filed Dec. 5, 2019, which was published in English under PCT Article 21(2), which is incorporated herein in its entirety.

BACKGROUND

Directional deposition processes such as molecular beam epitaxy are techniques which have been used to grow materials on substrates.

Selective area growth is a technique used to form nanostructures of controlled shape and in controlled location by applying a patterned amorphous mask to the substrate and performing molecular beam epitaxy. Various other growth techniques can be used in a similar fashion, such as metal-organic vapor-phase epitaxy.

Molecular beam epitaxy is a method for depositing thin film single crystals onto a substrate. This method involves heating a material to be deposited such that it enters the gaseous phase generating, a beam which when directed to the substrate allows the material to condense on the substrate. The method is conducted at very low pressures: evaporated atoms having long mean free paths, such that they do not interact before reaching the substrate.

SUMMARY

Provided herein is a method of fabricating a hollow wall for controlling directional deposition of material. The method comprises: forming a layer of resist on a substrate; removing a portion of the resist selectively to form a channel in the resist; forming a layer of an amorphous dielectric material in the channel; and removing the resist to form the hollow wall. The channel has a front surface configured to prevent bending of a corresponding front face of the hollow wall.

Also provided is a method of fabricating a hollow wall for controlling directional deposition of material. The method comprises: forming a layer of resist on a substrate; removing a portion of the resist selectively to form a channel in the resist; depositing a layer of an amorphous dielectric material in the channel; and removing the resist to form the hollow wall. The channel includes a first surface and a second surface. The channel includes a protrusion arranged at a corner between the first surface and the second surface, the protrusion being configured to prevent distortion of a corresponding corner of the hollow wall.

Further provided is a method of fabricating a device. The method comprises fabricating a hollow wall using a method as provided herein; and depositing a material selectively over the substrate using a beam. The beam is directed towards the substrate in a direction selected such that the hollow wall prevents deposition of the material in a shadow region created by the hollow wall.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIG. 5b is an SEM micrograph of a hollow wall obtained using a channel as illustrated in FIG. 5a;

FIG. 6c is an SEM micrograph of a hollow wall obtained using a channel as illustrated in FIG. 6a;

Figure 1:
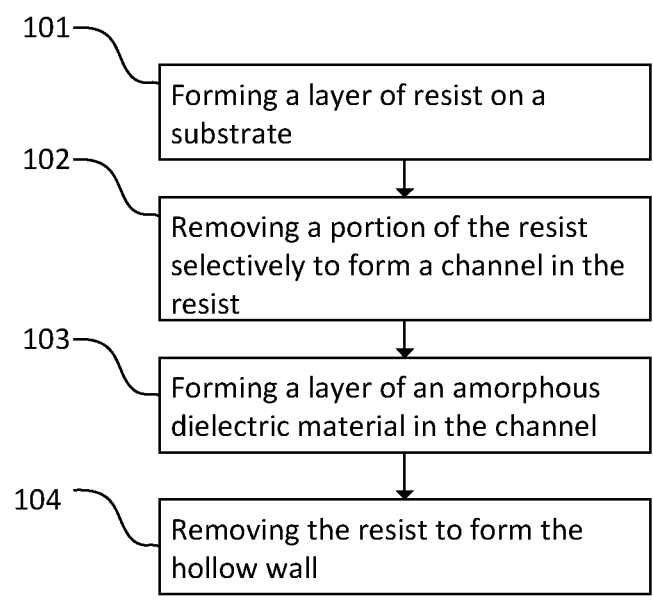
FIG. 1 is a flow chart outlining a method of fabricating a hollow wall.

It should be appreciated that, in schematic drawings, angles and/or relative proportions of components may be exaggerated for clarity of representation.

DETAILED DESCRIPTION OF EMBODIMENTS

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and refer to the orientation shown in the drawings. For the avoidance of any doubt, this terminology is not intended to limit the orientation of the device in an external frame of reference.

A "front" face in the context of the present disclosure is the face of a hollow wall which points towards an area to be patterned. In other words, a front face is proximal to the area to be patterned. Box A in FIG. 3 corresponds to part of a front face.

As used herein, the term "superconductor material" refers to a material which becomes superconductive when cooled to a temperature below a critical temperature, Tc, of the material. The use of this term is not intended to limit temperature during manufacturing processes.

A "nanowire" as referred to herein is an elongate member having a nano-scale width, and a length-to-width ratio of at least 10, or at least 50, or at least 100. A typical example of a nanowire has a width in the range 10 to 500 nm, optionally 50 to 100 nm or 75 to 125 nm. Lengths are typically of the order of micrometres, e.g. at least 1 μm, or at least 10 μm. In the present context, the nanowires are typically formed of a semiconductor material.

Geometric terms are used for convenience of description. The term "generally rectangular" refers to a shape which is based on a rectangle but includes modifications such as chamfering of one or more corners, curvature or serrations of one or more edges, etc. The term "generally triangular" refers to a shape which is based on a triangle but includes modifications such as serrations of one or more edges, or protrusions extending from one or more corners, etc.

The content of all documents cited herein is hereby incorporated by reference in its entirety.

Hollow walls are useful for selective deposition of materials using methods which involve the deposition of a material using a directional beam. The hollow walls block the beam, creating a "shadow" in which no material is deposited. Since the walls are thin, they may then be readily removed after the deposition process. A method for forming hollow walls is described in co-pending U.S. patent application Ser. No. 16/258,025, the content of which is hereby incorporated by reference.

A method of fabricating a hollow wall for controlling deposition of a material will now be described with reference to FIGS. 1 and 2.

Figure 2A:
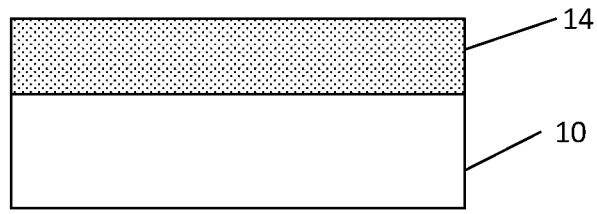
FIGS. 2a-2d are a series of schematic cross-sections of products obtained at various steps of the method of FIG. 1.

At block 101, a layer of resist 14 is formed on a substrate 10. A schematic cross-section of the product of this block is illustrated in FIG. 2A.

A "substrate" in the context of the present disclosure may be any structure on which the hollow wall is to be constructed. Typically, the substrate includes a wafer of semiconductor material. The substrate may include further structures arranged over the wafer. The substrate may include multiple layers of materials. The substrate may include a nanowire of semiconductor material arranged on a wafer.

Any semiconductor material may be used. Illustrative examples of semiconductor materials include III-V semiconductors, particularly those of Formula I:

$$InAs_xSb_{1-x} \quad (1)$$

where X is in the range 0 to 1. In other words, semiconductor component 16 may comprise indium antimonide (x=0), indium arsenide (x=1), or a ternary mixture comprising 50% indium on a molar basis and variable proportions of arsenic and antimony (0<x<1). Materials in this class have favourable properties for quantum computing applications, particularly, good compatibility with superconductor materials such as aluminium.

Indium arsenide, InAs, has been found to have good handling properties. Indium antimonide, InSb, may provide improved performance for certain devices. The ternary mixtures have intermediate properties between those of the binary compounds InAs and InSb. Values of x in the range 0.35 to 0.8 may provide particular advantages for some applications.

In particular, materials of Formula 1 may be arranged as nanowires.

One example wafer material is indium phosphide, which is a high band-gap semiconductor. Other examples include gallium arsenide, indium antimonide, indium arsenide, and silicon.

The nature of the resist is not particularly limited provided that it is compatible with the techniques to be used. The resist is typically an electron beam resist. Resists are known in the field of semiconductor fabrication.

The layer of resist 14 has a depth. Controlling the depth of the layer of resist 14 may allow control over the height of the hollows walls which are obtained. The depth of the layer of resist may be, for example, in the range 0.5 μm to 2 μm.

One useful technique for forming the layer of resist 14 is spin-coating. Spin-coating may allow for even application of the resist, to obtain a substantially equal depth over the surface of the substrate 10. Spin-coating may also allow for good control over the thickness of the layer of resist 14. Thickness may be controlled by selecting the number of spin-coating cycles.

Figure 2B:
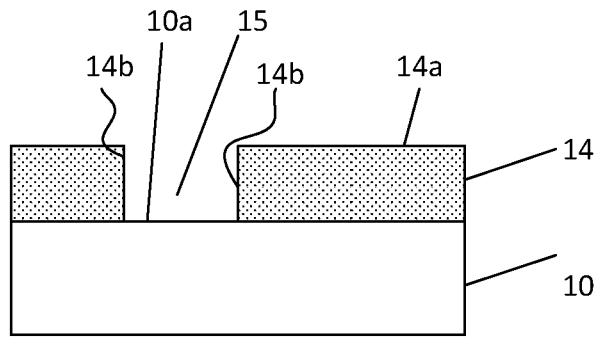

At block 102, a portion of the resist is removed selectively to form a channel in the resist. The result of this step is illustrated in FIG. 2B.

This step removes part of the layer of resist 14 to form a partial layer of resist over the wafer 10. The partial layer of resist 14 defines a channel 15. A region 10a of a surface of the substrate 10 is exposed in the channel 15. Channel 15 is defined by inner side-surfaces 14b of the partial resist layer 14 which extend from the surface of the substrate 10 to a top surface 14a of the resist layer 14.

The shape and position of channel 15 determines the shape and position of the hollow walls 18 which will be fabricated by the method.

Lithography may be used to remove the resist selectively. In examples where the resist comprises an electron beam resist, parts of the layer of resist 14 are exposed to an electron beam. The electron beam alters the solubility of the resist to a resist developer.

The resist may be a positive resist or a negative resist. For a positive resist, the areas which are to be removed are exposed to the electron beam, causing these areas to become soluble in the developer. For a negative resist, areas of the resist 14 which are not to be removed are exposed to the electron beam, such that the resist 14 in these areas becomes insoluble in the developer.

After the resist 14 has been exposed to the electron beam, it is developed using a resist developer.

Resists, and appropriate developers, are known in the field of semiconductor fabrication.

Although this example has been explained with reference to an electron beam resist, the technique used to remove the resist selectively may be chosen as appropriate depending on the nature of the resist. Certain resists may be developed by other techniques, such as exposure to light having a particular wavelength.

Any residual resist remaining in the channel 15 after the removal step may be removed using a descum process, which is known in the art.

FIG. 2B illustrates removal of only one part of the layer of resist 14. For some applications, it is useful to remove multiple parts of the layer of resist 14 as this may allow a plurality of hollow walls to be obtained. As will be explained later, the use of multiple hollow walls may be useful for fine control over the deposition of a material.

Figure 2C:
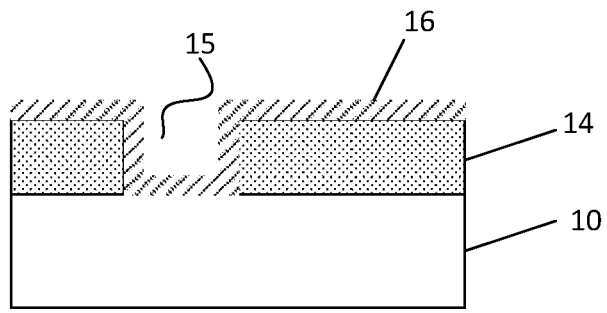
Figure 2D:
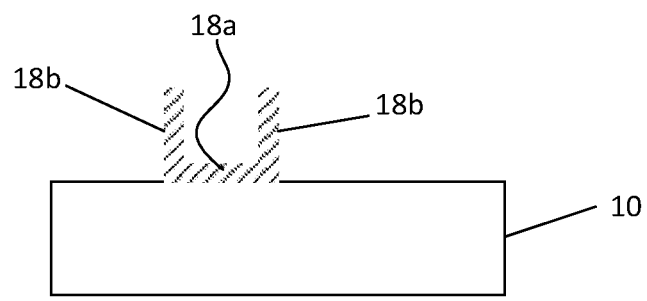

At block 130, a layer of amorphous dielectric material 16 is formed on the surface of the substrate to obtain a structure as illustrated in FIG. 2C.

The amorphous dielectric material will form the wall. Examples of useful amorphous dielectric materials include silicon nitride and silicon oxide, in particular silicon nitride.

The thickness of the layer of amorphous dielectric material 16 will determine the thickness of the hollow wall 18. The thickness is typically in the range 30 to 300 nm, e.g. 30 to 100 nm. In the methods of the present disclosure, selected portions of the layer may have smaller thicknesses, below 30 nm as will be explained further below.

Forming the layer of amorphous dielectric material 16 may comprise directly depositing the amorphous dielectric material. Alternatively, a precursor may be deposited and then reacted to form the amorphous dielectric material in situ. One class of precursors for forming silicon oxide in situ is the hydrogen silsesquioxanes, HSQ. HSQs may be converted into silicon oxides in situ by exposure to an electron beam or electromagnetic radiation of an appropriately-selected wavelength.

The amorphous dielectric material or the precursor thereof is typically deposited non-directionally. One example technique for non-directional deposition of an amorphous dielectric material is magnetron sputtering.

The layer of amorphous dielectric material 16 covers the exposed portion 10a of the substrate 10 in the channel 15 and the side surfaces 14a, 14b of the resist which define the channel 15.

In the present example, the layer of amorphous dielectric material 16 also covers the top surface 14a of the layer of resist 14. The portions of the layer covering the top surface of the layer of resist 14 are removed in a subsequent step.

FIG. 2C shows a layer of amorphous dielectric material 16 having a substantially uniform thickness over the side-surfaces of the layer of resist 14 and the exposed surface of the substrate 10 in the cavity 15. In variants, the thickness of the layer of wall material is not necessarily uniform. Non-uniform layers can still produce usable hollow walls.

The present example uses a single layer of amorphous dielectric material. In a variant, two or more layers of different materials may be formed. This results in a hollow wall formed of a composite material. The use of composite materials may allow for stress compensation.

At block 104, remaining parts of the layer of resist 14 are removed to form a hollow wall 18 arranged on the substrate 10.

Any amorphous dielectric material which was deposited on the top surface of the resist 14 is removed along with the resist 14. This then leaves a hollow shadow wall 13 standing in the location of channel 15.

The hollow wall 18 comprises a base 18a formed of the wall material in the region 10a that was previously left exposed by the (now removed) partial resist layer 14, and side portions 18b formed from the amorphous dielectric material that was previously covering the inner side-surface 14b of the partial resist layer 14.

The resist 14 may be removed via lift-off, which is known in the art. One example of a lift-off solvent is acetone.

After lift-off, plasma cleaning may be performed to remove impurities from the surface of the substrate 10. Oxygen plasma treatment may be used. Oxygen plasma treatment may oxidise the surface of silicon nitride to form a silicon oxide coating.

The inventors have found that the reliable manufacture of hollow walls having a well-defined geometry is challenging. It has been observed that very precise control over the shape of the channel formed at block 102 is possible, and the shape is maintained when amorphous dielectric material is deposited at block 103. However, the inventors have found that the shape of the finished hollow walls may be deformed. The deformations are not consistent, varying between individual walls resulting in walls having unique shapes. This makes it more difficult to control reliably the deposition of a material.

Without wishing to be bound by theory, it is believed that bending of faces of walls and distortions at corners may be introduced when the resist is removed. Internal mechanical stress within the walls is believed to be a contributory factor.

Figure 3:
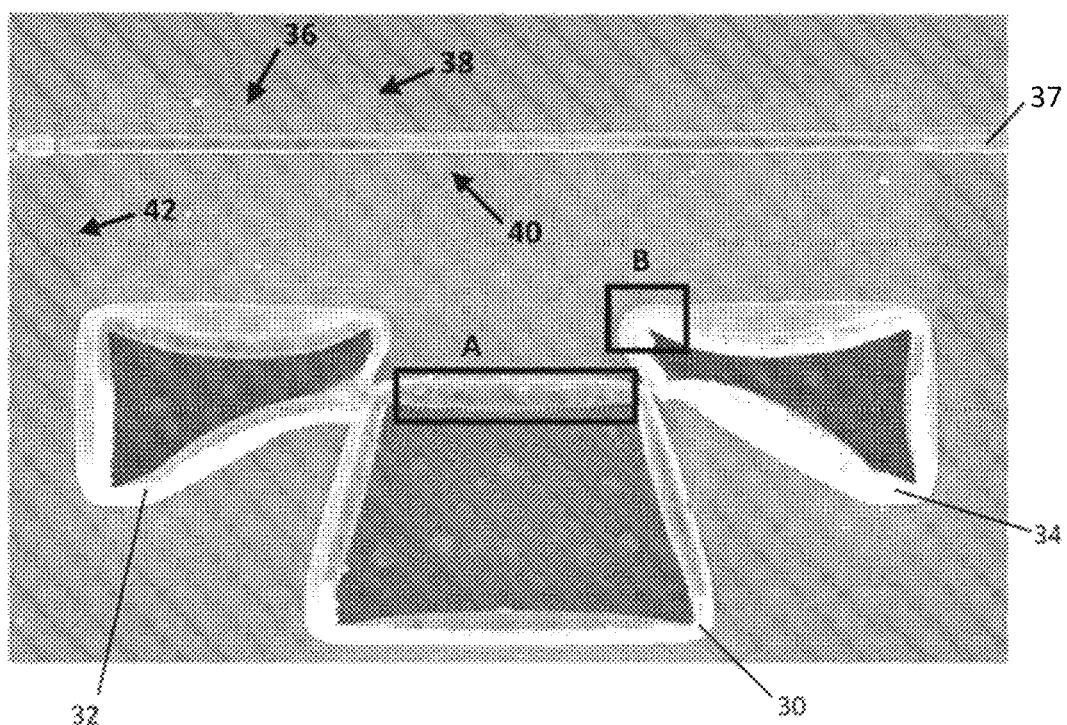
FIG. 3 is a scanning electron microscopy, SEM, micrograph of a device fabricated using hollow walls in accordance with a comparative example, with annotations showing bending, distortions, and their effects.

FIGS. 3 and 4 illustrate problems identified by the inventors.

FIG. 3 is an SEM micrograph showing three hollow walls 30, 32, 34 produced from channels having simple block shapes. These walls are formed of silicon nitride, and were fabricated using the method described above with reference to FIG. 1. Hollow wall 30 was fabricated using a simple trapezoidal-shaped channel. Hollow walls 32 and 34 were fabricated using generally triangular-shaped channels. The hollow walls 30, 32, 34 were used to control deposition of aluminium on a nanowire 37.

Figure 4A:
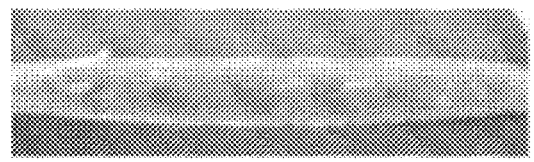
FIG. 4a is an enlarged portion of FIG. 3 showing bending of a face of a hollow wall.

Hollow wall 30 has a front face which has bent (region A). An enlarged image of this part of hollow wall 30 is shown in FIG. 4a. More pronounced bends are present on the front faces of hollow walls 32 and 34. As a result of this bending, an irregular shadow is produced: the shadow is bent in areas 36 and 38, and extends less distance than was desired at 40.

Figure 4B:
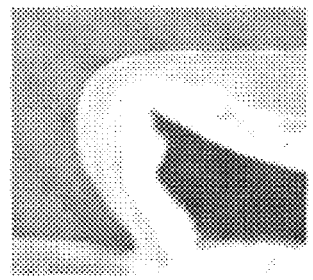
FIG. 4b is an enlarged portion of FIG. 3 showing distortion of a corner of a hollow wall.

Further bends in the shadow are observed at its sides, as highlighted at 42. The inventors believe that this is a result of distortion of corners of hollow walls 32 and 34. One such corner is in region B, and an enlarged view of this corner is shown in FIG. 4b. As may be seen, the shape of the corner is distorted.

Since the shadows did not have the intended shape, aluminium was deposited at undesired locations. Devices for quantum computing applications must be manufactured to very high precision. Unwanted deposition of material may be highly detrimental to device performance In a worst-case scenario, the device is short-circuited and completely unusable. This is a particular difficulty when scaling up devices, as increased device size and complexity makes it more likely that a defect will occur somewhere in the device.

Figure 5A:
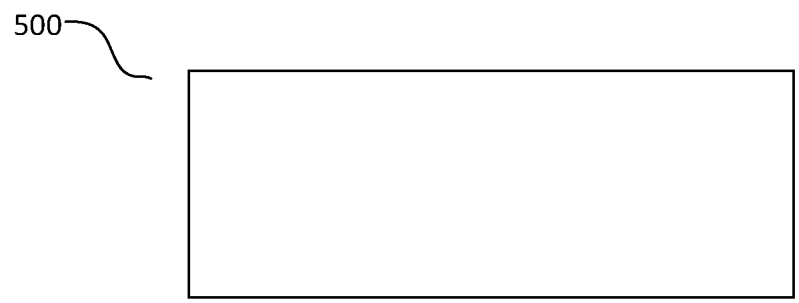
FIG. 5a is a schematic plan view of a channel for forming a hollow wall in accordance with a comparative example.
Figure 5B:
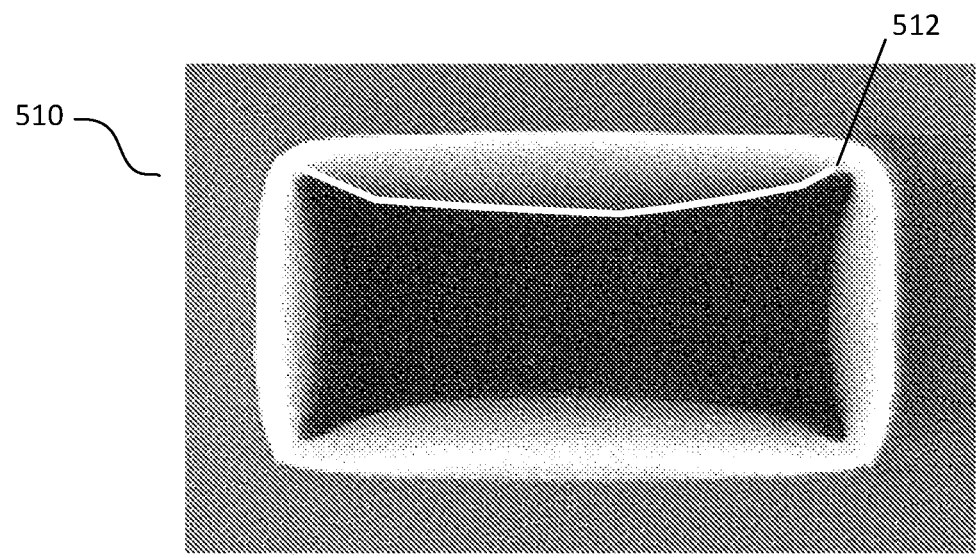

FIG. 5 provides a further illustration of the problem of bending observed by the inventors. FIG. 5a shows a schematic plan view of a channel shape 500, in this case a basic rectangular shape; and FIG. 5b shows an SEM micrograph of a hollow wall 510 obtained using such a channel shape. FIG. 5b is annotated with a line 512 to show more clearly the shape of the front face of the hollow wall 510.

As may be clearly seen, the front face of the hollow wall has bent such that its shape deviates significantly from the intended line shape.

It would be desirable to provide a method of fabricating hollow walls having a face with improved linearity.

Figure 6A:
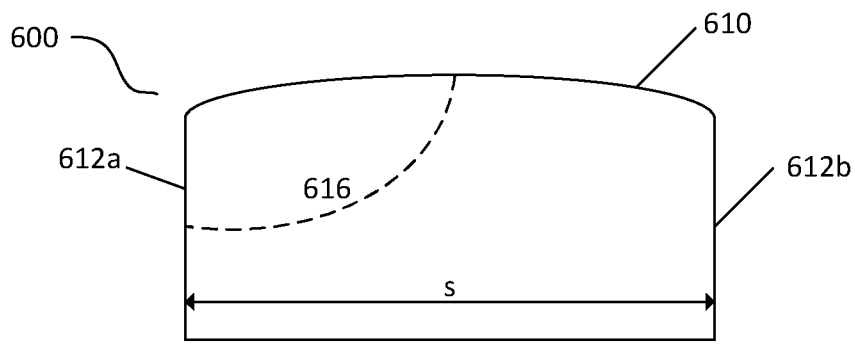
FIG. 6a is a schematic plan view of a channel for forming a hollow wall in accordance with a first example of the present disclosure, annotated to illustrate one technique for determining curvature.
Figure 6B:
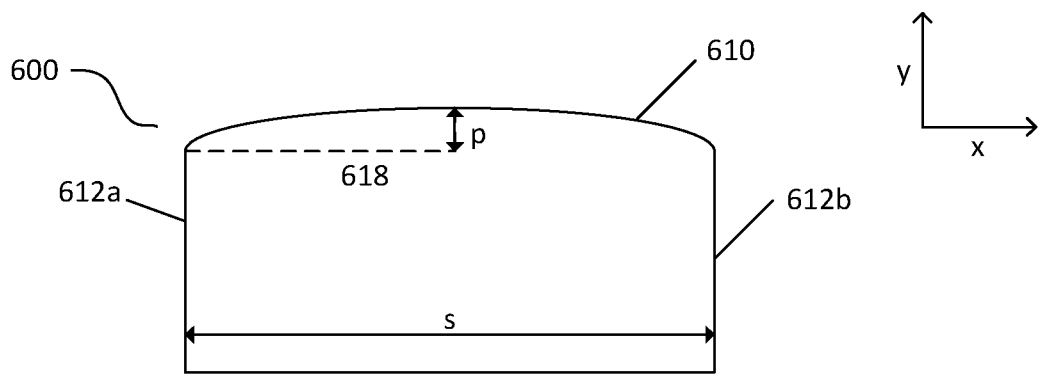
FIG. 6b is a schematic plan view of a channel as shown in FIG. 6a, annotated to illustrate an alternative technique for determining curvature.
Figure 6C:
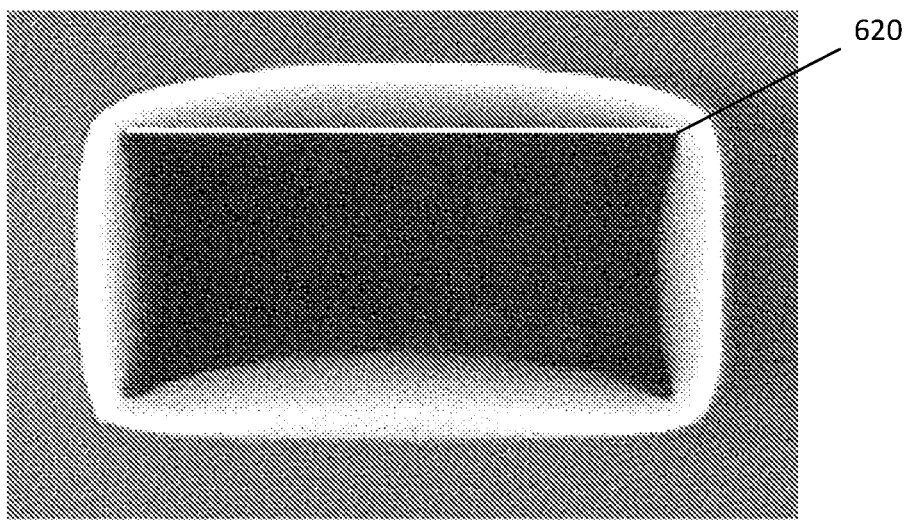

FIGS. 6a and 6b each show plan views of first example of a channel shape 600 according to the present disclosure, with differing annotations. FIG. 6c shows an image of a hollow wall obtained using the channel shape of FIG. 6a/FIG. 6b.

Channel 600 has a generally rectangular shape. The front surface 610 of the generally rectangular shape has an outward curvature. The degree of curvature is selected such that, when a hollow wall is formed using this channel shape, the corresponding front face 620 is approximately linear. Thus, the negative effects of bending of the front face in the comparative example are avoided.

The internal angle 616 between a mid-point of the front surface 610 of the generally rectangular shape and a mid-point of one side surfaces 612a, 612b of the generally rectangular shape provides a measure of the amount of curvature. The front surface 610 may have a curvature selected such that this angle is in the range 96 to 104°, for example 98 to 102° or 99 to 101°. An example has an angle of about 100°. Levels of curvature within these ranges have been found to be particularly useful for preparing hollow walls having linear faces. This range is especially applicable when the channel has a spacings between the side walls in the range 1.8 to 2.2 µm.

The amount of curvature may be adjusted depending on the distance between the side surfaces of the rectangle. Longer channels may benefit from greater curvature.

An alternative measure of curvature will now be described with reference to FIG. 6b.

A line 618 is projected in an x direction from the corner between a side surface 612a and the front surface 610, perpendicular to the direction of side surface 612a. The distance from the side surface to the widest part of the curve of front surface 610 is 0.5 s.

Let distance p be how far the curved face deviates from a linear face at its mid-point, in other words, the distance in the y direction from the mid-point of the front surface 610 to line 618.

Distances p and 0.5 s may obey the relationship:

$$\tan\theta = \frac{p}{0.5s}$$

where θ is in range 6 to 14°, optionally 8 to 12°, or 9 to 11°, or about 10°. This provides a degree of curvature observed to result in walls with good linearity, particularly when s is in the range 1.8 to 2.2 µm.

Figure 7:
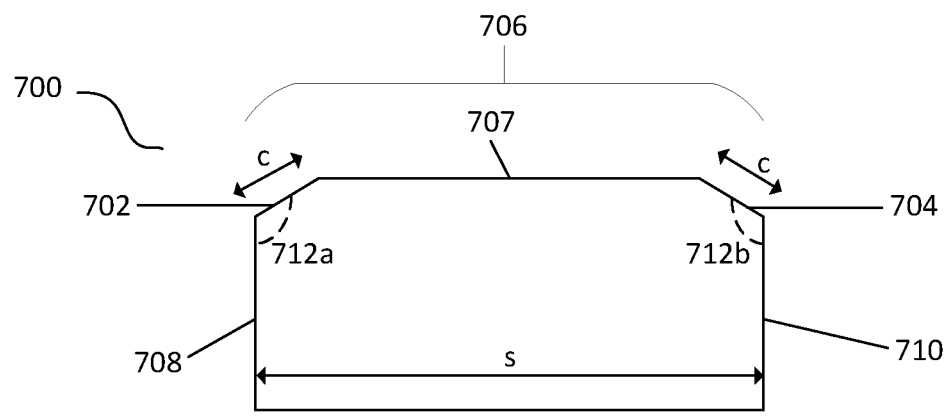
FIG. 7 is a schematic plan view of a channel for forming a hollow wall in accordance with a second example.

FIG. 7 shows another example of a channel shape 700 having a front surface configured to reduce bending of the resultant hollow wall. The channel shape 700 is a generally rectangular shape having chamfered portions 702, 704 at corners between the front surface 706 and side surfaces 708, 710 of the channel.

In this example, the internal angles 712a, 712b between the side surfaces 708, 710 and the chamfered portions 702, 704 are each in the range 96° to 104°. Angles in this range, and particularly angles of 98° to 102°, 99° to 101°, or about 100°, have been found to be particularly useful for preventing negative effects associated with bending of the front face of the hollow wall.

The chamfered portions have lengths c in the range 500 to 700 nm. In certain examples, the non-chamfered portion 707 of the front surface may also have a length in the range 500 to 700 nm. More generally, each of the two chamfered portions and the non-chamfered portion may have equal lengths.

The spacing, s, between the side surfaces 708, 710 of the channel is typically in the range 1.5 to 2.5 µm.

It has been found that providing a channel shape with a front face which extends outwardly by providing chamfering at corners of the channel reduces the negative effects of bending of the front face of the hollow wall produced using the channel.

Although this example has been described with reference to specific dimensions, the internal angle at the chamfered portion, lengths of the chamfered portions, and relative length of the non-chamfered portion may be adjusted to generalise this effect to larger or smaller hollow walls.

This example is symmetrical, having two chamfered portions. In a variant, one corner is chamfered.

Figure 8:
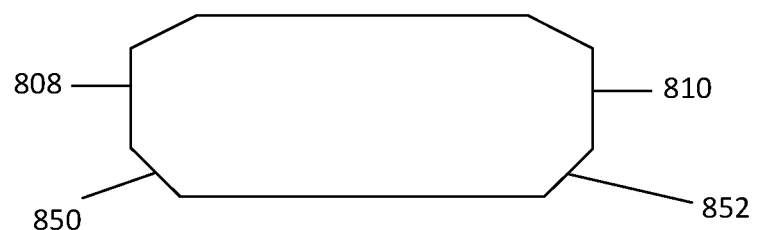
FIG. 8 is a schematic plan view of a channel for forming a hollow wall in accordance with a third example.

FIG. 8 shows a variant of the channel shape shown in FIG. 7. In this example, corners 850, 852 between side surfaces 808, 810 and rear surface 812 of the channel are also provided with a chamfer. This may allow improved reproducibility of the side faces of the hollow wall produced using the channel, which may be advantageous in examples where more than one face is to be used to control deposition of material.

In examples where only the front face of the hollow wall is to be used, the configuration of the rear face is not particularly limited.

In the examples shown in FIGS. 7 and 8, the chamfered portions are generally linear portions. In variants, the chamfered portions may be curved. In such examples, the internal angle will vary along the arc of the chamfered portion. The relevant measure of internal angle is then the internal angle between a point on the side wall and a mid-point the arc. In this example, length of the chamfer is measured along the arc.

Figure 9:
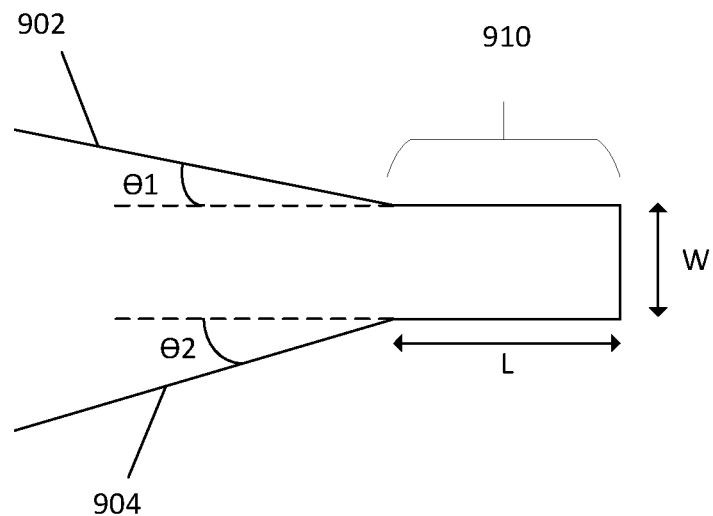
FIG. 9 is a schematic plan view of a portion of a channel configured to reduce distortion of a corner of the hollow wall.

FIG. 9 shows a plan view of a portion of a channel, which includes a protrusion 910 for preventing distortion of a corner of a hollow wall.

The protrusion 910 is an extension of the channel arranged at a corner between first and second surfaces 902, 904 of the channel.

The protrusion may have a length L in the range 50 to 150 nm. Lengths in the range 70 to 100 nm may be preferred for some applications. The length typically does not exceed about 300 nm, as increased susceptibility to distortion may be observed.

The protrusion may have a width W in the range 30 to 100 nm.

The protrusion is angled with respect to each of the first and second surfaces of the channel. The angles θ1, θ2, which are internal angles between the first or second surface, respectively, and an adjoining surface of the protrusion minus 180°, are less than 45°, typically in the range 20° to 45°.

By including a protrusion having the above-described parameters, it has been found that the effects of distortion at corners of the hollow wall may be reduced.

The wall portion which is formed in the region of the protrusion may be thinner than wall portions remote from the protrusion. This is because, during deposition of the wall material, narrow regions of the channel receive a lower flux of material than wider portions of the channel. For example, material thickness in the region of the protrusion may be less than 30 nm, whereas the thickness of typical wall portions is in the range 30 to 100 nm. Without wishing to be bound by theory, it is believed that the presence of reduced amounts of material in the region of the protrusion means that less stress accumulates in the material, thereby reducing deformation of the corner.

Figure 10:
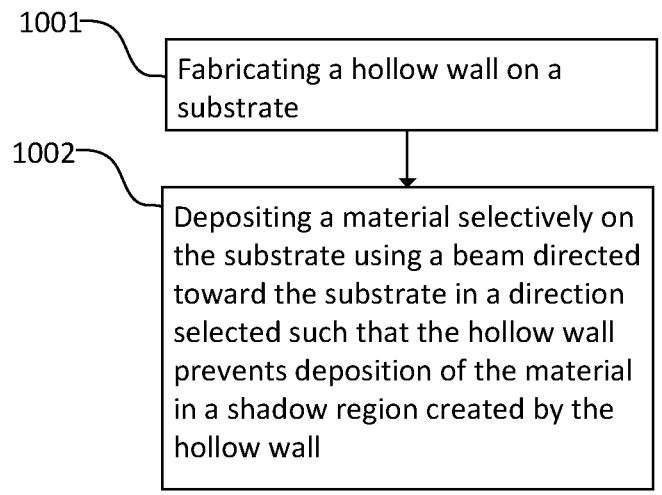
FIG. 10 is a flow chart outlining a method of fabricating a device using hollow walls.

FIG. 10 is a flow chart outlining a method of fabricating a device, using the hollow walls of the present disclosure.

At block 1001, a hollow wall is fabricated on a substrate using the method as described previously with reference to FIGS. 1 and 2. The channel for forming the hollow wall is configured to reduce bending of a face of the hollow wall, as previously described with reference to FIGS. 6 to 8; or includes a protrusion configured to prevent distortion of a corner of the hollow wall as described with reference to FIG. 9.

A plurality of hollow walls may be fabricated. Positions and orientations of the hollow walls may be selected as desired, depending on where material is to be deposited. One useful configuration of a plurality of hollow walls will be described in further detail below with reference to FIG. 11.

In a variant, additional components are formed or placed on the substrate after fabrication of the hollow walls. A nanowire is one example of such an additional component.

At block 1002, material is deposited selectively on the substrate using a beam directed toward the substrate in a direction selected such that the hollow wall prevents deposition of the material in a shadow region created by the hollow wall.

The material is deposited on the substrate via directional deposition. The shadow wall creates shadow regions on the device in which no material is deposited. As a result, a pattern of the material is formed on the surface of the device.

The material may be selected as desired. Examples include superconductor materials, semiconductor materials, and dielectrics.

Various types of direction deposition are known. Molecular beam epitaxy or electron gun epitaxy may be used, for example.

Examples of superconductor materials include aluminium, lead, indium, and tin. Such materials may be stored as a solid in source cells and evaporated in order to be projected at the device. Examples of semiconductor materials include those of Formula 1, as previously defined.

One or more additional depositions may follow. The material deposited in the subsequent depositions may be the same material as in the first deposition, or a different material. In one example, a superconductor may be deposited in a first deposition, and a dielectric may be deposited in a second deposition. The angle at which the material is deposited may vary with each deposition. By varying the angle, different patterns can be created on the device using the same hollow walls.

After material has been deposited, the side walls 13b of the hollow wall 13 may be removed. Mechanical methods such as sonication are preferred for some applications where chemical methods may cause damage. Since the walls are hollow, removal by mechanical methods is made easier.

Removal of the walls by sonication may comprise placing the device in a liquid bath and applying ultrasonication. Other mechanical methods may be used. Generally, thinner walls are easier to remove, but more fragile.

After removal of the walls, a thin footprint on the wafer 10 corresponding to the base of wall may remain. This thin footprint is generally well-tolerated in any subsequent fabrication steps.

Figure 11:
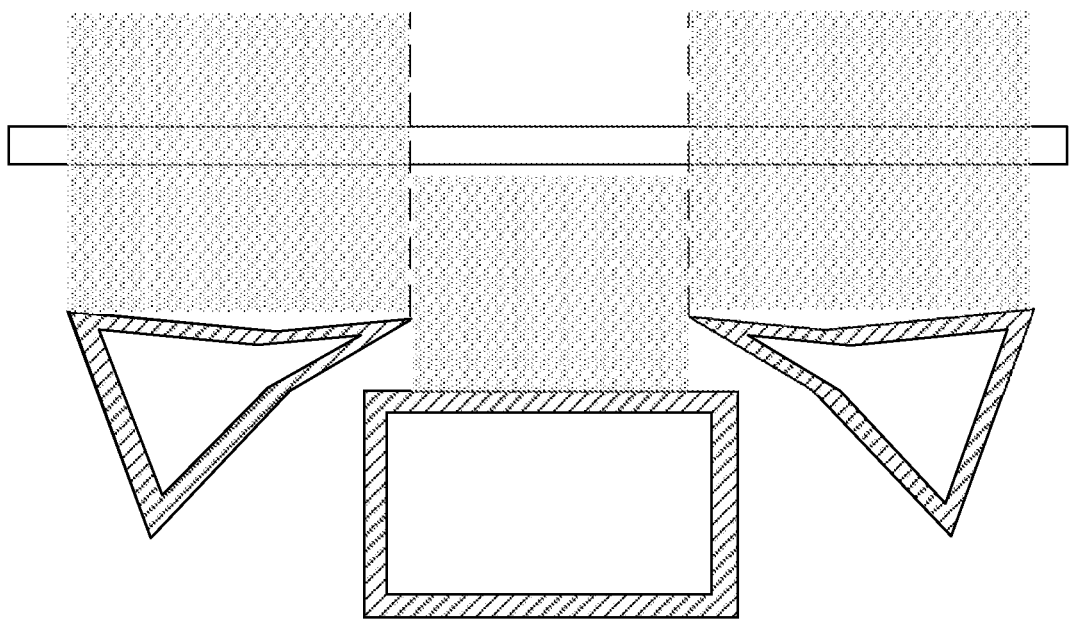
FIG. 11 is a schematic plan view of an example arrangement of hollow walls for controlling deposition of material.

FIG. 11 illustrates how a combination of hollow walls of the type described with reference to FIGS. 6 to 8 with hollow walls of the type described with reference to FIG. 9 to achieve good control over the deposition of a material (in this example, a superconductor material) on a target (in this example, a selected of a nanowire).

Points of generally triangular hollow walls 1110 and 1112 are well-defined and thus provide shadow regions 1114a, 1114b with sharp, well-defined edges 1115a, 1115b. Front surfaces of the generally triangular hollow walls 1110 and 1112 cast shadows over left- and right-hand portions of the nanowire, respectively, such that material is deposited only in a selected central area of the nanowire.

A rectangular hollow wall 1118 is arranged between and to the rear of triangular hollow walls 1110 and 1112. Rectangular hollow wall 1118 casts a shadow 1114c over a region in front of the hollow wall, almost to the nanowire. Since the front face of rectangular hollow wall 1118 is well-defined, the extent of the shadow 1114c is finely controlled. The arrangement of triangular hollow walls 1110 and 1112 relative to rectangular hollow wall 1118 helps to ensure that shadow 1114c has well-defined edges. As shown in FIG. 11, the points of triangular hollow walls 1110, 1112 are in front of rectangular hollow wall 1118.

Figure 12:
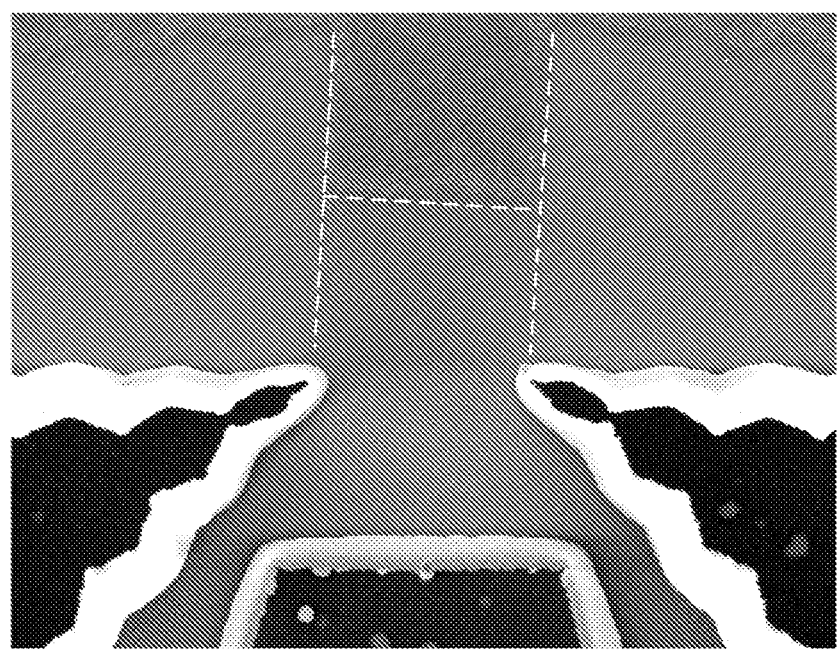
FIG. 12 is an SEM micrograph of a device following deposition of aluminium using an arrangement of hollow walls as shown in FIG. 11.

FIG. 12 is an SEM micrograph illustrating that the arrangement shown in FIG. 11 allows for precise control over the edges of the shadows. Edges are highlighted with dotted lines. As may be seen, the shadow has straight edges, and the sides of the shadow are parallel. The image shows azimuth misalignment. The misalignment was due to the use of a manual cleaving process during fabrication, rather than any effect of the shadow walls.

The bottom left- and right-hand sides of FIG. 12 show corners of shadow walls produced using the channels including the shape shown in FIG. 9. As may be seen, sharp, well-defined corners were obtained. These examples were fabricated using a channel having serrated sides. Such a serrated pattern has been found to reduce bending effects. Serrations are described in more detail in co-pending U.S. patent application Ser. No. 16/258,025.

It will be appreciated that the above embodiments have been described by way of example only.

More generally, according to one aspect disclosed herein, there is provided a method of fabricating a hollow wall for controlling directional deposition of material, which method comprises: forming a layer of resist on a substrate; removing a portion of the resist selectively to form a channel in the resist; forming a layer of an amorphous dielectric material in the channel; and removing the resist to form the hollow wall; wherein the channel has a front surface configured to prevent bending of a corresponding front face of the hollow wall. The inventors have found that faces of hollow walls formed on surfaces of channels which are linear in plan have a tendency to bend during the fabrication process. By modifying the shape of the channel, improved linearity of the face of the wall may be achieved. For example, configuring the channel to have a surface which is convex in plan may counteract the effects of bending.

A hollow wall may controls directional deposition of material by blocking a beam of material, thereby defining a shadow region in which no material is deposited.

Forming the layer of the amorphous dielectric material may comprise forming the layer in the channel and over the layer of resist. Removing the resist to form the hollow wall may include removing the amorphous dielectric material formed over the resist.

The amorphous dielectric material may be silicon nitride or a silicon oxide. The amorphous dielectric material may be formed in situ from an appropriate precursor, for example an HSQ in the case of silicon oxide.

The channel may have a generally rectangular shape comprising the front surface, a rear surface opposite the front surface, and a pair of side surfaces. The generally rectangular shape may include a chamfered corner between the front surface and one of the pair of side surfaces, the chamfered corner having an internal angle to the respective side surface and a chamfer length selected to prevent bending of the front face of the hollow wall. Providing the channel with chamfered corners is one useful approach for counteracting the effects of bending.

The chamfer angle may be in the range 96 to 104°. The chamfer length may be in the range 400 to 800 nm, optionally 500 to 700 nm. The pair of side surfaces may be spaced from one another by a distance in the range 1.5 to 2.5 μm, optionally 1.8 to 2.2 μm. This is one example of a channel shape which has been investigated and demonstrated to produce a hollow wall having a front face with good linearity. Chamfer lengths and angles may be adapted as appropriate depending on the overall size of the hollow wall to be fabricated. Generally, the greater the spacing between the side surfaces, the greater the chamfer angle and/or chamfer length.

Both corners between the front surface and the side surface may be chamfered.

The generally rectangular shape may further include respective chamfered corners between each of the pair of side surfaces and the rear surface. This may be particularly useful where it is desired to deposit one or more materials from two or more different directions. In such examples, good control over the geometries of all of the faces of the hollow wall may be achieved.

The front surface may have an outward curvature selected to prevent bending of the front face of the hollow wall. In other words, the front surface may have a convex curvature in plan.

The channel may include a pair of opposed side surfaces at respective ends of the front surface, wherein the outward curvature is such that in an internal angle between a midpoint of the front surface and one of the pair of opposed side surfaces is in the range 96° to 104°. In this example, the opposed side surfaces may be spaced from one another by a distance in the range 1.8 to 2.2 μm. This combination of degree of curvature and lengths of the hollow wall has been found to be effective for producing a wall with good linearity.

Removing the resist selectively may form a plurality of channels in the resist, the plurality of channels including a second channel for forming a second hollow wall. The second channel may include a first surface and a second surface. The second channel may include a protrusion arranged at a corner between the first surface and the second surface, the protrusion being configured to reduce distortion of a corresponding corner of the second hollow wall.

By forming multiple hollow walls, and in particular multiple hollow walls having different shapes, precise control over the deposition of a material may be achieved. Various different combinations of shapes of hollow walls, and various different relative orientations of those shapes, may be used to achieve deposition in a desired position.

The plurality of channels may comprise a first channel, the first channel being a channel having a front surface configured to prevent bending of a corresponding front face of a hollow wall of the type described above, and two second channels arranged on either side of the first channel.

This configuration may allow a shadow having both a well-defined extent and well-defined side edges to be obtained. The second channels may be arranged such that protrusions of the second channels are in front of corners of the first channel, in order to obtain a shadow with a sharp edge.

Another aspect provides a method of fabricating a hollow wall for controlling directional deposition of material, which method comprises: forming a layer of resist on a substrate; removing the resist selectively to form a channel in the resist; depositing a layer of an amorphous dielectric material in the channel; and removing the resist to form the hollow wall. The channel may include a first surface and a second surface. The channel may include a protrusion arranged at a corner between the first surface and the second surface, the protrusion being configured to prevent distortion of a corresponding corner of the hollow wall.

It has been found that by providing a protrusion at a corner between two side surfaces, a sharp corner may be obtained. In use, this allows for more precise control over the deposition of material.

The protrusion may have a length in the range 50 to 150 nm. The protrusion may be angled relative to the first surface and the second surface by an angle in the range 20 to 45°. Protrusions having these lengths and orientations have been found to be particularly useful.

The first and second surfaces may be serrated so as to prevent bending of corresponding first and second faces of the hollow wall.

The channel may have a generally triangular shape.

A still further aspect provides a method of fabricating a device, which method comprises: fabricating a hollow wall using a method as described hereinabove; and depositing a material selectively over the substrate using a beam. The beam is directed towards the substrate in a direction selected such that the hollow wall prevents deposition of the material in a shadow region created by the hollow wall.

Hollow walls fabricated by the methods described herein have well defined geometries, rendering them particularly useful for the precise deposition of material.

The method may further comprise, after the depositing, removing the hollow wall.

Since the walls produced by the methods provided herein are hollow, they may be relatively easy to remove in comparison with solid walls, i.e. solid blocks of material. The hollow wall may be removed mechanically, for example. One useful technique for mechanical removal of hollow walls is sonication. Mechanical methods are preferred over chemical methods for some applications, because components of some devices may be susceptible to damage by certain reagents.

The substrate may comprise a semiconductor. The material may comprise a superconductor material.

The techniques disclosed herein are particularly useful for the construction of semiconductor-superconductor hybrid devices.

The method may further comprise, before the depositing, forming a nanowire on the substrate. The depositing may comprise depositing the materials selectively on at least a portion of the nanowire.

Nanowires are of interest for the construction of semiconductor-superconductor hybrid devices. The methods described herein have been successfully applied to the controlled deposition of superconductor materials onto nanowires at selected positions.

The present disclosure provides the following clauses:
Clause 1. A method of fabricating a hollow wall for controlling directional deposition of material, which method comprises:
    forming a layer of resist on a substrate;
    removing a portion of the resist selectively to form a channel in the resist;
    forming a layer of an amorphous dielectric material in the channel; and
    removing the resist to form the hollow wall;
wherein the channel has a front surface configured to prevent bending of a corresponding front face of the hollow wall.

Clause 2. The method according to Clause 1, wherein the channel has a generally rectangular shape comprising the front surface, a rear surface opposite the front surface, and a pair of side surfaces;

wherein the generally rectangular shape includes a chamfered corner between the front surface and one of the pair of side surfaces, the chamfered corner having an internal angle to the respective side surface and a chamfer length selected to prevent bending of the front face of the hollow wall.

Clause 3. The method according to Clause 2, wherein the internal angle is in the range 96 to 104°.

Clause 4. The method according to Clause 2 or Clause 3, wherein the chamfer length is in the range 400 to 800 nm.

Clause 5. The method according to any of Clauses 2 to 4, wherein the pair of side surfaces are spaced from one another by a distance in the range 1.5 to 2.5 µm.

Clause 6. The method according to any of Clauses 2 to 5, wherein the generally rectangular shape further includes respective chamfered corners between each of the pair of side surfaces and the rear surface.

Clause 7. The method according to Clause 1, wherein the front surface has an outward curvature selected to prevent bending of the front face of the hollow wall.

Clause 8. The method according to Clause 7, wherein the channel includes a pair of opposed side surfaces at respective ends of the front surface, wherein the outward curvature is such that an internal angle between a mid-point of the front surface and one of the pair of opposed side surfaces is in the range 96° to 104°.

Clause 9. The method according to Clause 8, wherein the opposed side surfaces are spaced from one another by a distance in the range 1.8 to 2.2 µm.

Clause 10. The method according to any preceding Clause, wherein removing a portion of the resist selectively forms a plurality of channels in the resist, the plurality of channels including a second channel for forming a second hollow wall, wherein the second channel includes a first surface and a second surface; and wherein the second channel includes a protrusion arranged at a corner between the first surface and the second surface, the protrusion being configured to reduce distortion of a corresponding corner of the second hollow wall.

Clause 11. The method according to Clause 10, wherein the plurality of channels comprises a first channel, the first channel being the channel as defined in any of claims 1 to 9, and two second channels arranged on either side of the first channel.

Clause 12. A method of fabricating a hollow wall for controlling directional deposition of material, which method comprises:

forming a layer of resist on a substrate;

removing a portion of the resist selectively to form a channel in the resist;

depositing a layer of an amorphous dielectric material in the channel; and removing the resist to form the hollow wall;

wherein the channel includes a first surface and a second surface; and wherein the channel includes a protrusion arranged at a corner between the first surface and the second surface, the protrusion being configured to prevent distortion of a corresponding corner of the hollow wall.

Clause 13. The method according to Clause 12, wherein that the protrusion has a length in the range 50 to 150 nm.

Clause 14. The method according to Clause 12 or Clause 13, wherein the protrusion is angled relative to the first surface and the second surface by an angle in the range 20 to 45°.

Clause 15. The method according to any of Clauses 12 to 14, wherein the first and second surfaces are serrated so as to prevent bending of corresponding first and second faces of the hollow wall.

Clause 16. The method according to any of Clauses 12 to 15, wherein the channel has a generally triangular shape.

Clause 17. A method of fabricating a device, which method comprises:

fabricating a hollow wall using the method according to any preceding claim; and depositing a material selectively over the substrate using a beam;

wherein the beam is directed towards the substrate in a direction selected such that the hollow wall prevents deposition of the material in a shadow region created by the hollow wall.

Clause 18. The method according to Clause 17, further comprising, after the depositing, removing the hollow wall.

Clause 19. The method according to Clause 18 or Clause 19, wherein the substrate comprises a semiconductor, and wherein the material comprises a superconductor material.

Clause 20. The method according to any of Clauses 17 to 19, further comprising, before the depositing, forming a nanowire on the substrate; and wherein the depositing comprises depositing the materials selectively on at least a portion of the nanowire.

Other variants or use cases of the disclosed techniques may become apparent to the person skilled in the art once given the disclosure herein. The scope of the disclosure is not limited by the described embodiments but only by the accompanying claims.

The invention claimed is:

1. A method of fabricating a hollow wall, which method comprises:

forming a layer of a resist on a substrate;

removing a portion of the resist selectively to form a channel in the resist;

forming a layer of an amorphous dielectric material in the channel in the resist, wherein the amorphous dielectric material is silicon oxide or silicon nitride; and removing the resist and portions of the amorphous dielectric material situated on the resist to form the hollow wall, wherein the hollow wall has a generally rectangular shape comprising a front surface, a rear surface opposite the front surface, and a pair of side surfaces and wherein the generally rectangular shape includes a chamfered corner between the front surface and one of the pair of side surfaces, the chamfered corner having an internal angle to the respective side surface.

2. The method according to claim 1, wherein a chamfer length is selected to prevent bending of the front face of the hollow wall.

3. The method according to claim 2, wherein the internal angle is in a range 96° to 104°.

4. The method according to claim 2, wherein the chamfer length is in a range 400 nm to 800 nm.

5. The method according to claim 2, wherein the pair of side surfaces are spaced from one another by a distance in a range 1.5 µm to 2.5 µm.

6. The method according to claim 2, wherein the generally rectangular shape further includes respective chamfered corners between each of the pair of side surfaces and the rear surface.

7. The method according to claim 1, wherein the front surface has an outward curvature selected to prevent bending of the front face of the hollow wall.

8. The method according to claim 7, wherein the channel includes a pair of opposed side surfaces at respective ends of the front surface, wherein the outward curvature is such that an internal angle between a mid-point of the front surface and one of the pair of opposed side surfaces is in a range 96° to 104°.

9. The method according to claim 8, wherein the opposed side surfaces are spaced from one another by a distance in a range 1.8 to 2.2 µm.

10. The method according to claim 1, wherein removing the portion of the resist forms a plurality of channels in the resist, the plurality of channels including a second channel for forming a second hollow wall, wherein the second channel includes a first surface and a second surface, and wherein the second channel includes a protrusion arranged at a corner between the first surface and the second surface, the protrusion being configured to reduce distortion of a corresponding corner of the second hollow wall.

11. The method according to claim 10, wherein the plurality of channels comprises a first channel and two second channels arranged on either side of the first channel.

12. A method of fabricating a device, which method comprises:

fabricating a hollow wall by the steps of:

forming a layer of a resist on a substrate, removing a portion of the resist selectively to form a channel in the resist, forming a layer of an amorphous dielectric material in the channel in the resist, wherein the amorphous dielectric material is silicon oxide or silicon nitride, and removing the resist and portions of the amorphous dielectric material situated on the resist to form the hollow wall, wherein the hollow wall has a generally rectangular shape comprising a front surface, a rear surface opposite the front surface, and a pair of side surfaces and wherein the generally rectangular shape includes a chamfered corner between the front surface and one of the pair of side surfaces, the chamfered corner having an internal angle to the respective side surface; and depositing a material selectively over the substrate having the hollow wall using a beam, wherein the beam is directed towards the substrate in a direction selected such that the hollow wall prevents deposition of the material in a shadow region created by the hollow wall.

13. The method according to claim 12, further comprising, after the depositing, removing the hollow wall.

14. The method according to claim 13, wherein the substrate comprises a semiconductor, and wherein the material comprises a superconductor material.

15. The method according to claim 12, further comprising, before the depositing, forming a nanowire on the substrate; and wherein the depositing comprises depositing the material selectively on at least a portion of the nanowire.

* * * * *